(12) United States Patent
Baraton et al.

(10) Patent No.: US 9,206,509 B2
(45) Date of Patent: Dec. 8, 2015

(54) METHOD FOR THE CONTROLLED GROWTH OF A GRAPHENE FILM

(75) Inventors: Laurent Baraton, Paris (FR); Costel Sorin Cojocaru, Palaiseau (FR); Didier Pribat, Sevres (FR)

(73) Assignees: ECOLE POLYTECHNIQUE, Palaiseau (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 13/124,413

(22) PCT Filed: Oct. 16, 2009

(86) PCT No.: PCT/EP2009/063617
§ 371 (c)(1),
(2), (4) Date: Apr. 21, 2011

(87) PCT Pub. No.: WO2010/043716
PCT Pub. Date: Apr. 22, 2010

(65) Prior Publication Data
US 2011/0198313 A1 Aug. 18, 2011

(30) Foreign Application Priority Data
Oct. 17, 2008 (FR) .................................. 08 05769

(51) Int. Cl.
| | |
|---|---|
| *B05D 5/12* | (2006.01) |
| *B05D 3/10* | (2006.01) |
| *B05D 3/06* | (2006.01) |
| *B05D 3/02* | (2006.01) |
| *C23C 14/48* | (2006.01) |
| *C23C 14/58* | (2006.01) |
| *B32B 38/10* | (2006.01) |

(Continued)

(52) U.S. Cl.
CPC ............. *C23C 16/26* (2013.01); *C23C 16/0281* (2013.01); *C23C 16/56* (2013.01); *C30B 25/02* (2013.01); *C30B 29/02* (2013.01)

(58) Field of Classification Search
None
See application file for complete search history.

(56) References Cited

U.S. PATENT DOCUMENTS 8,980,217 B2 * 3/2015 Hiura et al. .................... 423/448
2006/0233692 A1 * 10/2006 Scaringe et al. .............. 423/335

(Continued)

FOREIGN PATENT DOCUMENTS

| CN | 101285175 A | 10/2008 |
|---|---|---|
| JP | 2008 050228 A | 3/2008 |

OTHER PUBLICATIONS

Database WPI Week 2008, Thomson Scientific, London, GB; AN 2008-002862, XP002532444: Di, Z. et al.: "Graphene preparation comprises using chemical vapor deposition including placing substrate with catalyst into free-oxygen reactor, increasing substrate temperature, and adding carbonaceous substance to reactor."

(Continued)

*Primary Examiner* — Allan Olsen
(74) *Attorney, Agent, or Firm* — Baker & Hostetler LLP

(57) ABSTRACT

The invention includes a controlled graphene film growth process including the production on the surface of a substrate of a layer of a metal having with carbon a phase diagram such that, above a molar concentration threshold ratio $C_M/C_M+C_C$, where $C_M$ is the molar metal concentration in a metal/carbon mixture and $C_C$ is the molar carbon concentration in the mixture, a homogeneous solid solution is obtained. The metal layer is exposed to a controlled flux of carbon atoms or carbon-containing radicals or carbon-containing ions at a temperature such that the molar concentration ratio obtained is greater than the threshold ratio to obtain a solid solution of carbon in the metal. The process further includes an operation for modifying the phase of the mixture into two phases, a metal phase and a graphite phase, leading to the formation of at least a lower graphene film at the metal layer incorporating carbon atoms-substrate interface and an upper graphene film at the surface of the metal layer.

20 Claims, 8 Drawing Sheets

(51) Int. Cl.
| | |
|---|---|
| *C23C 16/26* | (2006.01) |
| *C23C 16/02* | (2006.01) |
| *C23C 16/56* | (2006.01) |
| *C30B 25/02* | (2006.01) |
| *C30B 29/02* | (2006.01) |

(56) References Cited

U.S. PATENT DOCUMENTS

| | | | |
|---|---|---|---|
| 2009/0181502 A1 | 7/2009 | Parikh et al. | |
| 2010/0224851 A1* | 9/2010 | Colombo et al. | 257/9 |
| 2010/0323113 A1* | 12/2010 | Ramappa et al. | 427/398.1 |
| 2011/0265918 A1* | 11/2011 | Fujita et al. | 148/537 |
| 2012/0003438 A1* | 1/2012 | Appleton et al. | 428/195.1 |
| 2012/0258587 A1* | 10/2012 | Kub et al. | 438/610 |
| 2012/0280226 A1* | 11/2012 | Ivanov et al. | 257/43 |
| 2013/0341792 A1* | 12/2013 | Noda et al. | 257/741 |
| 2014/0308523 A1* | 10/2014 | Veerasamy et al. | 428/408 |
| 2015/0079352 A1* | 3/2015 | Sung et al. | 428/172 |

OTHER PUBLICATIONS

Abe Hiroaki, et al.: "Formation mechanisms for carbon onions and nanocapsules in C+-ion implanted copper," Journal of Applied Physics, American Institute of Physics. New York, vol. 90, No. 7, Oct. 1, 2001, pp. 3353-3358, XP012054220.

Geim, et. al. "The rise of graphene," Nature Materials, vol. 6, Mar. 2007, pp. 183-191.

Sutter, et al. "Epitaxial graphene on ruthenium," Nature Materials, vol. 7, Apr. 6, 2008, p. 406.

Kim, et al. "large-scale pattern growth of graphene films for stretchable transparent electrodes," Nature, vol. 457, Feb. 5, 2009, pp. 706-710.

Reina, et al. "Transferring and Identification of Single- and Few-Layer Graphene on Arbitrary Substrates," J. Phys. Chem. C., vol. 112, No. 46, 2008, pp. 17741-17744.

Reina, et al. "Large Area, Few-Layer Graphene Films on Arbitrary Substrates by Chemical Vapor Deposition," Nano Lett., American Chem. Soc., Dec. 2, 2008, pp. A-F.

De Arco, et al. "Synthesis, Transfer, and Devices of Single- and Few-Layer Graphene by Chemical Vapor Deposition," IEEE Transactions on Nanotechnology, vol. 8., No. 2., Mar. 2009, pp. 135.

Novoselov, et al., "Electric Field Effect in Atomically think Carbon Films," Science, 306, 666, Oct. 22, 2004, pp. 666-669.

Eda, et al., "Large-area ultrathin films of reduced graphene oxide as a transparent and flexible electronic material," Nature, Nanotechnology, vol. 3, Apr. 6, 2008, pp. 270-274.

\* cited by examiner

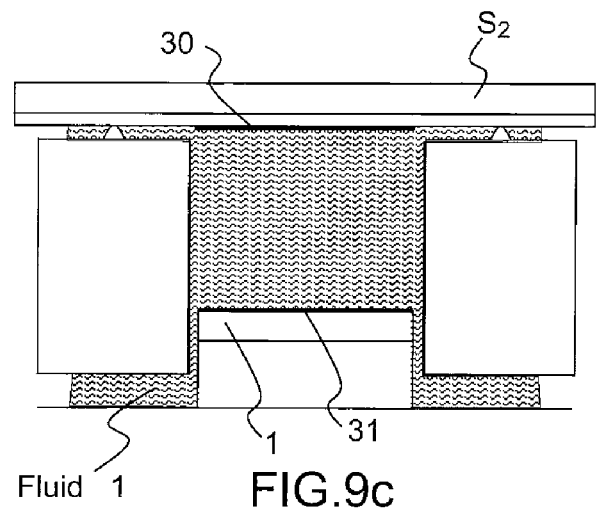
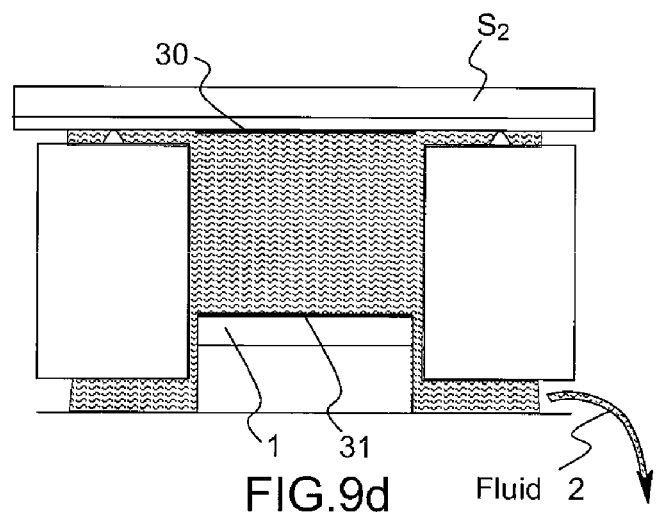
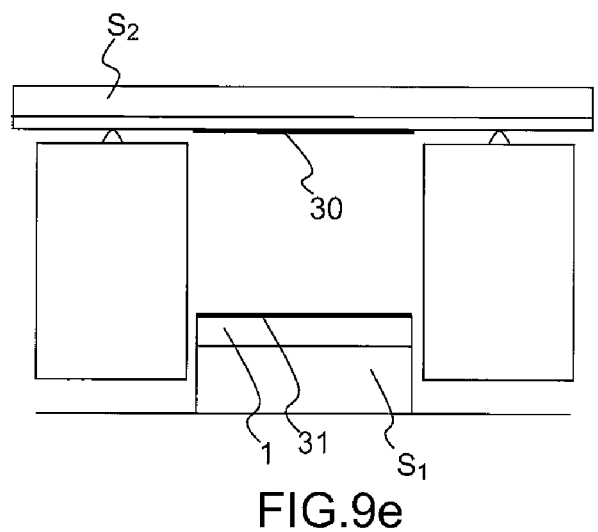

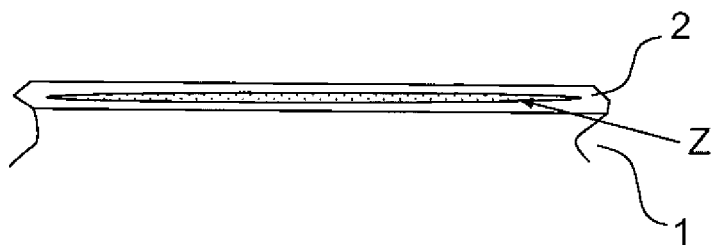
FIG.10a
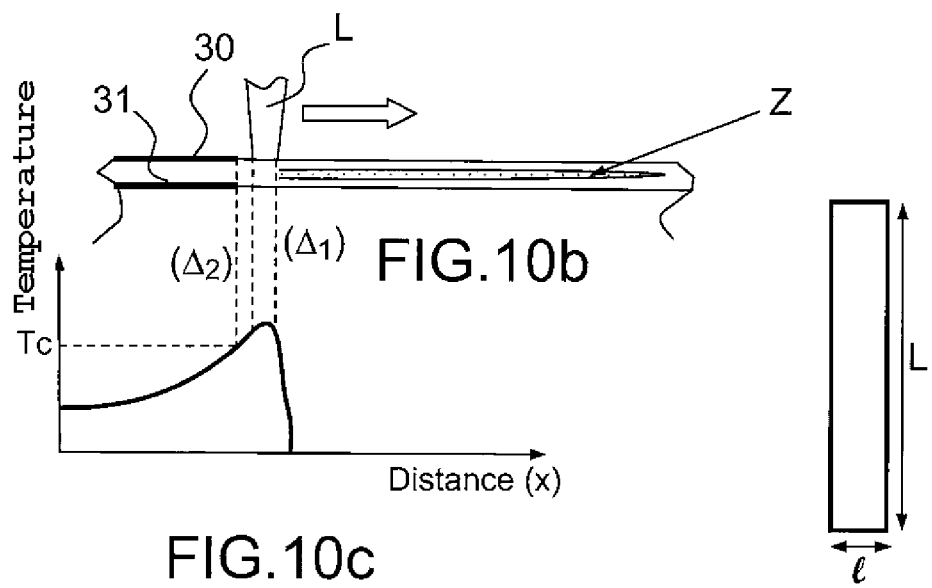
FIG.10b
FIG.10c
FIG.10d

METHOD FOR THE CONTROLLED GROWTH OF A GRAPHENE FILM

CROSS-REFERENCE TO RELATED APPLICATIONS

This application is a National Stage of International patent application PCT/EP2009/063617, filed on Oct. 16, 2009, which claims priority to foreign French patent application No. FR 08 05769, filed on Oct. 17, 2008, the disclosures of which are incorporated by reference in their entirety.

FIELD OF THE INVENTION

The field of the invention is that of processes for producing very thin conductive layers of graphene, which has the great benefit of being transparent and consequently finding many applications in the electronics and display fields because of the excellent electrical conductivity and absorption properties of this type of material.

BACKGROUND OF THE INVENTION

Graphene is a two-dimensional crystal of carbon formed from a monoatomic layer of sp2 hybrid carbon atoms (having the structure of a benzene ring corresponding to hexagonal cells), graphite being formed from graphene sheets having a thickness corresponding to the size of a carbon atom.

Notably, the article "The Rise of Graphene", Nature Materials, Vol. 6, page 183, 2007 by A. K. Geim and K. S. Novoselov has shown an atomic plane of sp2 hybrid carbon atoms and the various structures that may stem therefrom: fullerenes, carbon nanotubes and graphite that are illustrated in the present application by FIGS. 1a, 1b, 1c and 1d respectively.

Although evoked in the formation of fullerenes, carbon nanotubes and graphite, graphene had never been isolated and studied. Its stability has even been contested, all the crystals having a tendency of having been thermodynamically unstable at small thicknesses (the surface atoms less well bonded become predominant in relation to those of the volume).

The first graphene films were isolated in 2004 (K. S. Novoselov et al., "Electric Field Effect in Atomically Thin Carbon Films", Science, Vol. 306, page 666, 2004) and have proved to be remarkably stable. These films are obtained by "exfoliating" blocks of a graphite called HOPG (Highly Ordered Pyrolytic Graphite), which is a commercial material. Graphite is a lamellar material formed from stacks of graphene sheets, and the bonds between horizontal planes are weak. Exfoliation consists in removing graphene planes using adhesive tapes. The method is simple and not very reproducible, but it does make it possible to obtain graphene sheets measuring of the order of 10 to a few tens of μm in one of the dimensions.

Obtaining these first graphene sheets has made it possible to characterize them and to show that graphene is a stable, highly conductive ambipolar material (i.e. able to exhibit two types of conduction, by holes or by electrons; it is in fact a zero-gap semiconductor) having high carrier (electron or hole) mobilities (of the order of 10 000 to 100 000 cm$^2$/Vs at low temperature).

Very advantageously, graphene may thus be applied, on the one hand, to the fabrication of thin-film transistors (provided that the width of the strips is precisely controlled so as to open an energy gap in the band structure of the material) while on the other hand it makes it possible to provide thin transparent metal layers as a replacement for transparent conductive oxides (i.e. ITO or indium tin oxide) in flat screen displays, in solar cells and in general in all applications requiring a transparent conductor. This material has proved to be beneficial for films having up to about four graphene monolayers (a material called FLG or "few-layers graphene"). This advantage is a major advantage in the context of seeking to replace ITO because of the rarity and therefore the costliness of indium.

However, for a practical use it seems difficult to employ the exfoliation method, as this does not enable the thickness (i.e. the number of graphene layers) or even the geometry of the deposit, to be precisely controlled.

Various preparative methods have been suggested, such as for example the partial oxidation of graphite in acid medium, enabling it to be exfoliated in liquid medium. The graphene can then be put into aqueous suspension and deposited, for example by filtration, by spray coating or spin coating but with the problem that the thickness of the layers obtained is not uniform.

To obtain acceptable electrical conductivity values, it is then necessary to carry out a chemical reduction (to remove the intercalated oxygen). A process of this type, which is nevertheless very complex, has been described in the article by G. Eda et al., Nature Nanotechnology, Vol. 3, page 270, May 2008.

SUMMARY OF THE INVENTION

In this context, the present invention proposes a simple and reproducible graphene film synthesis process for providing a graphene film that may have large dimensions.

More precisely, the subject of the invention is a controlled graphene film growth process characterized in that it comprises the following steps:

the production on the surface of a substrate of a layer of a metal having with carbon a phase diagram such that above a molar concentration threshold ratio $C_M/C_M+C_C$, where $C_M$ is the molar metal concentration in a metal/carbon mixture and $C_C$ is the molar carbon concentration in said mixture, a homogeneous solid solution is obtained;

the exposure of the metal layer to a controlled flux of carbon atoms or carbon-containing radicals or carbon-containing ions at a temperature such that the molar concentration ratio obtained is greater than the threshold ratio so as to obtain a solid solution of carbon in the metal; and an operation for modifying the phase of the mixture into two phases, a metal phase and a graphite phase respectively, leading to the formation of at least a lower graphene film located at the (metal layer incorporating carbon atoms)/substrate interface and an upper graphene film at the surface of the metal layer.

According to a variant of the invention, the process comprises a step of eliminating the upper graphene film and a step of eliminating the metal layer incorporating carbon atoms located between the two graphene films, possibly an operation of chemically etching the metal layer.

According to a variant of the invention, the process furthermore comprises:

an operation of chemically attacking the metal layer so as to detach the upper film and to expose the lower graphene film; and a step of transferring the upper graphene film to a second substrate.

According to a variant of the invention, the process comprises the following:

the substrate comprising the lower graphene film, the metal layer and the upper graphene film is placed in an enclosure in the presence of a solution for chemically etching the metal layer;

a second substrate is positioned facing the assembly formed by the two graphene films and the metal layer; and a stream of a solution is made to flow so as to bring the upper graphene film into contact with the second substrate after the metal layer has been chemically attacked.

According to a variant of the invention, the second substrate is made of a nonrefractory material, possibly of the glass or polymer type.

According to a variant of the invention, the operation for modifying the phase of the mixture into two phases, one of which is a graphite phase, includes cooling the carbon solid solution in the metal so as to make the carbon precipitate and form at least one graphene film.

According to a variant of the invention, the operation for modifying the phase of the mixture into two phases, one of which is a graphite phase, includes increasing the carbon concentration in the carbon solid solution in the metal.

The phase modification into two phases has notably been explained in the article by Sutter et al. Nature Materials, Vol. 7, page 406, May 2008).

According to a variant of the invention, the process further comprises a step of exposure to an oxidizing plasma so as to eliminate the upper graphene film.

According to a variant of the invention, the process further comprises a step of eliminating the metal layer incorporating carbon atoms so as to detach the lower graphene film.

Thus, according to the invention, it becomes possible to provide a film of high quality, greater than that of the upper film.

According to a variant of the invention, the metal layer incorporating carbon atoms is eliminated by chemically dissolving it.

According to a variant of the invention, the exposure to a controlled flux of carbon atoms or carbon-containing radicals or carbon-containing ions is carried out in a reactor using a gaseous precursor of the $CH_4$, $C_2H_2$ or $C_6H_6$ type by way of example, at a temperature of between about 450° C. and 900° C.

According to a variant of the invention, the exposure to a controlled flux of carbon atoms or carbon-containing radicals or carbon-containing ions is carried out by ion implantation.

According to a variant of the invention, the process further comprises, after the ion implantation operation, an annealing step enabling the carbon atoms within the metal layer to be homogenized, followed by a cooling step, so as to precipitate the carbon.

According to a variant of the invention, the metal layer is produced by epitaxy, the substrate being an inert single-crystal substrate which may be of the sapphire or quartz type or made of magnesium oxide.

According to a variant of the invention, the subsequent annealing step is carried out by means of a laser.

According to a variant of the invention, the laser is scanned in a plane parallel to the plane of the substrate so as to precipitate the graphene and promote the nucleation of graphene atoms after passage of said laser.

According to a variant of the invention, the metal is of the cobalt or nickel type or generally any type of transition metal (Ir, Ru, etc.).

BRIEF DESCRIPTION OF THE DRAWINGS

The invention will be better understood and other advantages will become apparent on reading the following description given by way of nonlimiting example and in conjunction with the appended figures in which:

FIGS. 9a to 9e illustrate the various steps of an example of a process of the invention that includes a transfer step for isolating each of the graphene films; and FIGS. 10a to 10d illustrate a variant of the invention in which a laser is used and, respectively, the implantation of carbon atoms into the layer, the illumination of the implanted metal layer by a moving laser, the temperature gradient obtained within the metal layer during the movement of the laser beam, and the typical shape of the laser beam focused by a cylindrical lens.

DETAILED DESCRIPTION

The graphene film growth process according to the invention consists in using an intermediate metal layer deposited on the surface of a substrate, the metal chosen having a limited range of solubility with carbon.

Various types of metal may be involved, notably cobalt, iron, nickel, ruthenium, iridium, etc.—in general any type of metal that can dissolve carbon in a limited range of the phase diagram. A typical example of a phase diagram is illustrated in FIG. 2 and relates to the phase diagram for the cobalt-carbon system; this example is not limiting, nickel and other metals have phase diagrams similar to that obtained with cobalt.

Figure 1A:
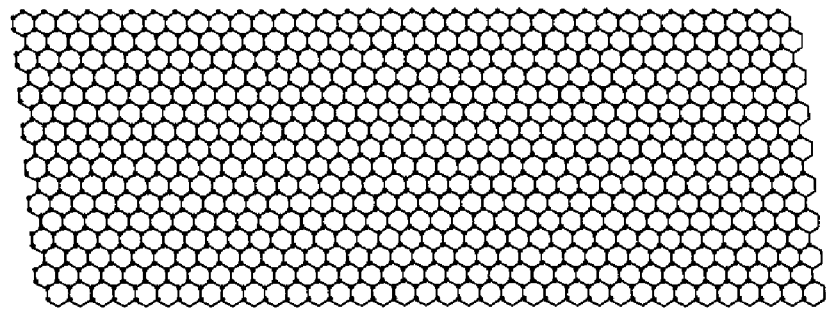
FIGS. 1a, 1b, 1c and 1d show respectively an atomic plane of sp2 hybrid carbon atoms corresponding to a graphene structure and various structures that may stem therefrom: fullernes, carbon nanotubes and graphite.
Figure 1B:
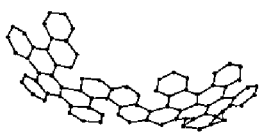
Figure 1B:
Figure 1B:
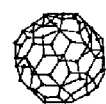
Figure 1C:
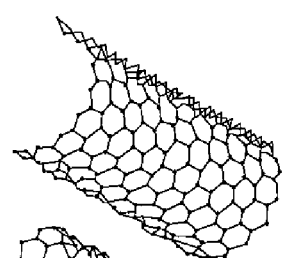
Figure 1C:
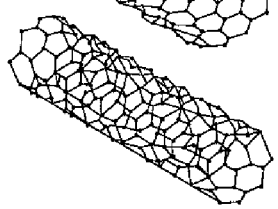
Figure 1D:
Figure 1D:
Figure 1D:
Figure 1D:
Figure 1D:
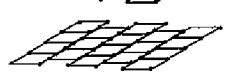
Figure 1D:
Figure 1D:
Figure 2:
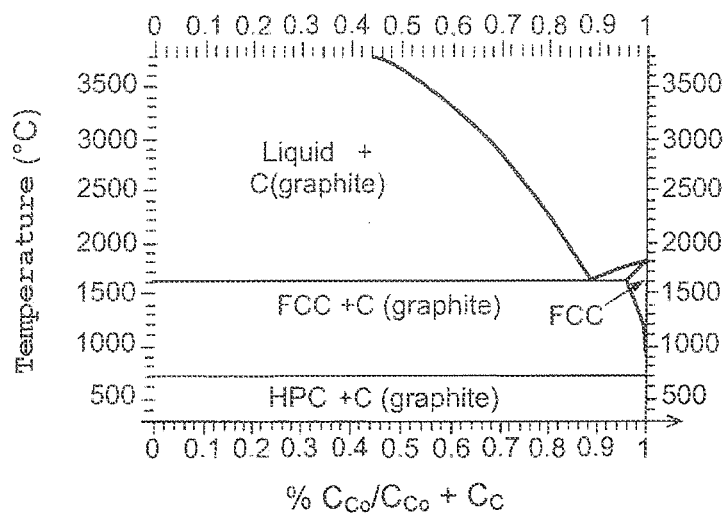
FIG. 2 illustrates the phase diagram of the cobalt-carbon system.

It is apparent in FIG. 2 that, on the metal-rich side, i.e. typically for a $C_{Co}/(C_{Co}+Cc)$ molar concentration ratio greater than 0.95, carbon forms a homogeneous solid solution FCC with the metal within the temperature range shown (C denoting graphite and HPC denoting Co in a hexagon close packed phase). Cobalt is face-centered cubic above a temperature of around 700° C. and hexagonal close packed at temperatures below this temperature.

However, when the carbon concentration increases, typically for a $C_{Co}/(C_{Co}+Cc)$ molar concentration ratio of less than 0.95 (below around 1500° C.), the solid solution is transformed into a mixture of metal and graphite, in the form of two separate phases (the carbon precipitates in the form of graphite).

Figure 3:
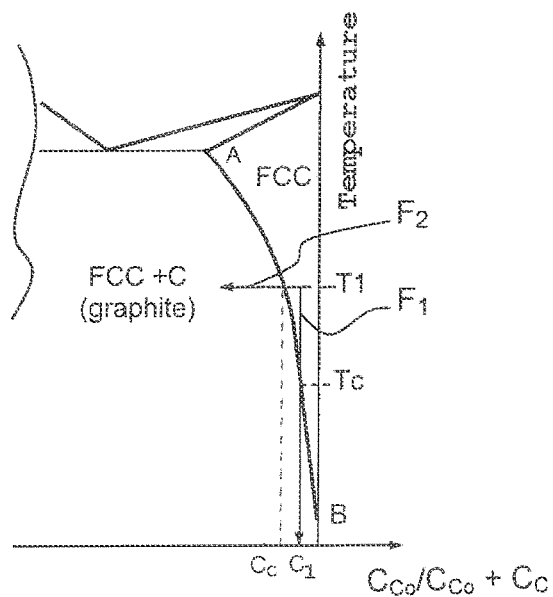
FIG. 3 illustrates the reaction pathways that can be used for synthesizing graphene in a process according to the invention.

The boundary between the homogeneous solid solution and the metal+graphite two-phase mixture is depicted schematically by the curve AB in FIG. 3, which shows an enlargement of part of the phase diagram illustrated in FIG. 2.

Starting from these observations, two reaction pathways are possible for synthesizing graphite and therefore, consequently, graphene.

First Reaction Pathway:

A certain amount of carbon, less than a concentration Cc, is introduced into the metal at a temperature T1 (as illustrated in FIG. 3, Cc representing the limit of solubility of carbon in the metal at the temperature T1) and the temperature is slowly lowered: the reaction pathway is represented by the arrow $F_1$. When the temperature reaches a threshold temperature Tc indicated in FIG. 3, the carbon starts to precipitate in the form of graphite.

Second Reaction Pathway:

At the temperature T1 for example, as illustrated in FIG. 3, the carbon concentration is varied: the reaction pathway is illustrated by the arrow $F_2$. This may be implemented for example by continuously depositing carbon on the surface of the metal followed by diffusion in the volume (examples of methods will be given in the application below). When the carbon concentration in the metal reaches the concentration Cc, the carbon precipitates in the form of graphite.

When the metal is in the form of a thin layer deposited on an inert substrate, the graphite precipitates on the surface and at the interface when one of the two reaction schemes described above is applied.

To obtain graphene (consisting, as will be recalled, of one atomic graphite plane or a few atomic graphite planes), all that is required is for the amount of carbon injected into the metal to be precisely controlled. For example, if the solubility of carbon in the metal is lower than the ambient temperature, typically of the order of $10^{15}$ to $10^{16}/cm^3$, it suffices to introduce $8 \times 10^{15}$ carbon atoms/$cm^2$ on the surface of the metal layer at the working temperature (a graphite carbon monolayer is equivalent to about $3.71\ 10^{15}$ carbon atoms/$cm^2$) and to cool the specimen (in accordance with the reaction pathway $F_1$ illustrated in FIG. 3). The thickness of the metal will be adapted to the limiting concentration of the phase diagram, taking the working temperature into account. For example, if the working temperature is 500° C. and a metal is used in which the limiting solubility of carbon at 500° C. is $8 \times 10^{20}$ atoms/$cm^3$ (and negligible at ambient temperature, i.e. less than $10^{15}$-$10^{16}/cm^3$), a minimum thickness of 100 nm of metal is required for entirely dissolving a dose of $8 \times 10^{15}$ carbon atoms/$cm^2$ at the surface of the metal. In general, the minimum thickness $e_{min}$ of metal for obtaining a graphene monolayer at the interface and at the surface of the metal (i.e. $2 \times 3.71\ 10^{15}$ atoms/$cm^2$) is $e_{min} = 7.42\ 10^{15}/Cc$, where Cc is the solubility limit of carbon in the metal at the temperature in question. If it is desired to use a smaller thickness of metal, it is necessary to work at a higher temperature, the solubility of carbon increasing with temperature (as illustrated in FIG. 3).

First Example of a Process of the Invention:

The process thus consists in using a thin layer of a suitable metal, i.e. the shape of the phase diagram of which on the metal side being as shown schematically in FIG. 3, in exposing it, at high temperature (typically from 400° C. to 1000° C.), to a controlled flux of carbon or a carbon precursor (for example, active radicals in a plasma reactor or in a CVD (chemical vapor deposition) reactor) and in slowly lowering the temperature so as to precipitate graphene on the surface of the metal and at the interface with the substrate.

Figure 4A:
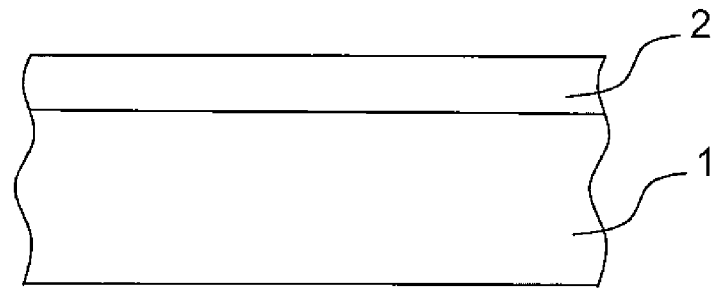
FIGS. 4a and 4b illustrate the first steps of the process of the invention, namely deposition of the metal layer on the surface of a substrate corresponding to a sectional view and to a top view, respectively, in the case of a thin etched metal layer.
Figure 4B:
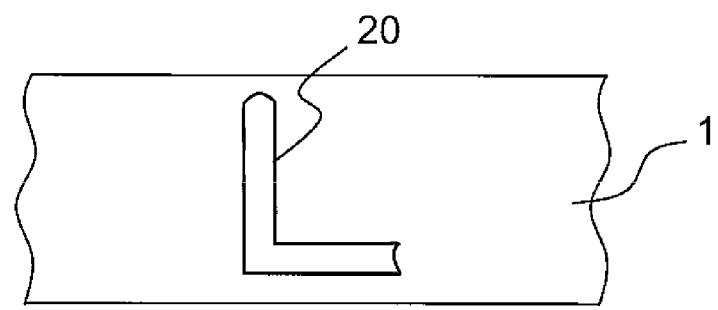

More precisely, starting from a substrate 1, a layer of chosen metal 2 is deposited as illustrated in FIG. 4a. Depending on the application, it is possible to etch the metal layer as shown in FIG. 4b so as to leave on the surface only a metal element 20 or several "patterned" elements, the features of which may be defined by conventional operations, and no longer an entire layer.

Figure 5:
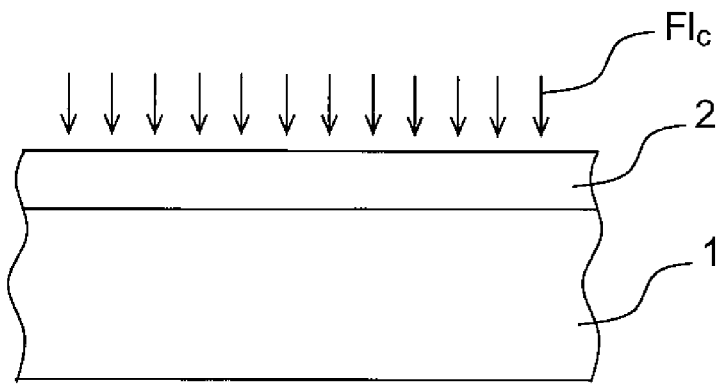
FIG. 5 illustrates the step of exposure to a flux of carbon atoms, radicals or ions within the metal layer in the process of the invention.

As illustrated in FIG. 5, the metal layer or only the metal element is exposed to a flux $Fl_c$ of carbon or carbon-containing radicals or ions.

The carbon may be introduced at a temperature typically between 450° C. and 1000° C., in a CVD or PECVD (Plasma-Enhanced CVD) reactor, using a gaseous precursor such as $CH_4$, $C_2H_2$, $C_6H_6$, etc. The exposure time is adapted according to the partial pressure of the gaseous precursor, its dissociation rate (and therefore the temperature, power of the plasma, etc.).

A precisely controlled cooling step is then carried out in accordance with the reaction pathway illustrated by the arrow $F_1$.

Figure 6A:
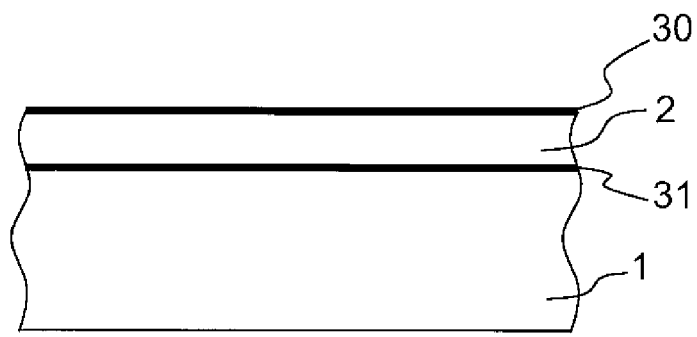
FIGS. 6a and 6b illustrate two views, one in cross section and the other from above, of a step for obtaining two graphene layers in the process of the invention.
Figure 6B:
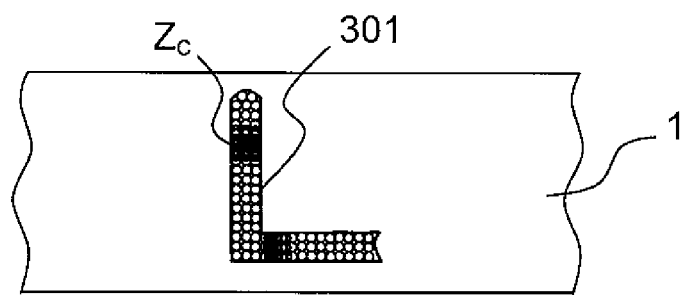

During the latter operation, as illustrated in FIGS. 6a and 6b, an upper graphene layer 30 and a graphene interface layer 31 are formed.

In fact, the graphene interface layer 31 is of better crystalline quality than that at the upper surface 30 or of patterned metal surface elements 301, the defects $Z_c$ of which are shown in FIG. 6b.

It is therefore particularly advantageous for this interface layer 31 to be preferentially exploited.

Figure 7:
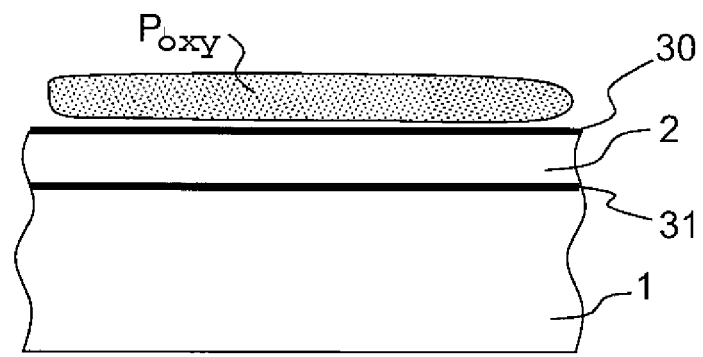
FIG. 7 illustrates a step of exposure to an oxidizing plasma in the process of the invention.

To do this, as illustrated in FIG. 7, the upper graphene layer 30 is removed by exposure to an oxidizing plasma $P_{oxy}$, which typically may be of the stream of oxygen or water vapor type. This operation also eliminates the amorphous carbon that will be deposited on the substrate on the surfaces where the metal has been removed (the case in which the metal was patterned beforehand).

Figure 8A:
FIGS. 8a and 8b illustrate a step of eliminating the metal layer at the end of the process of the invention, enabling the graphene interface layer to be detached.
Figure 8B:
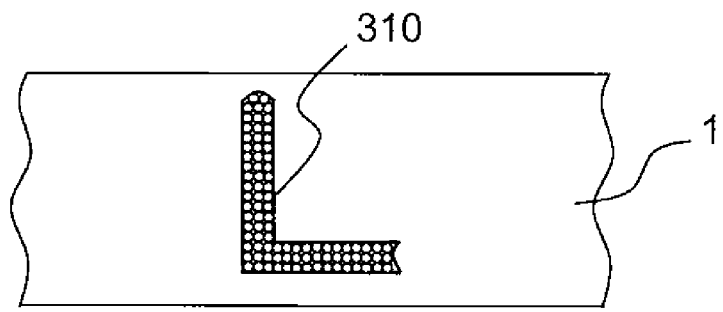

The metal is then removed (for example by chemically dissolving it), leaving on the substrate the graphene film 31 originally present at the interface as illustrated in FIGS. 8a and 8b in the case in which the metal was patterned beforehand by lithography—the graphene will be patterned in the same way on the substrate.

Second Example of a Process of the Invention:

Alternatively, the carbon may be introduced by ion implantation between the ambient temperature and 600° C., thereby making it possible for the dose incorporated into the metal to be well controlled. The process is then somewhat different insofar as an annealing operation is necessary in order to homogenize the carbon implanted in the metal film. Typically, the carbon-implanted metal film is heated to a temperature of between 450 and 900° C. before the controlled cooling step that enables graphene to be obtained by precipitation.

The reaction pathway is that illustrated in FIG. 3 by the arrow $F_2$ if the implanted dose is greater than the limiting solubility of carbon in the metal at the treatment temperature. If this is not the case, the reaction pathway is also $F_1$. If the high-temperature solubility limit is exceeded, additional graphite layers may be precipitated during cooling and it may be difficult to obtain a small number of graphene layers at the upper and lower interfaces of the metal. To do this, a quench may be carried out so as to "freeze" the number of graphene layers on the surface of the metal and at the interface with the substrate.

To improve the crystalline quality of the graphene at the interface, a metal layer grown epitaxially on an inert single-crystal substrate (sapphire, quartz, MgO, spinel, etc.) may be advantageously used.

Third Example of a Process of the Invention:

It may also be advantageous to use a transfer technique for recovering the two, upper and lower, graphene film obtained beforehand.

At the present time, the literature provides only methods for transferring the upper film, for which it is necessary to deposit on the upper graphene film, a polymer layer serving as transfer support. The two transfer supports presented are PMMA as described in the references: Alfonso Reina, Hyungbin Son, Liying Jiao, Ben Fan, Mildred S. Dresselhaus, ZhongFan Liu and Jing Kong, The Journal of Physical Chemistry C 112, 17741-17744 (2008); Alfonso Reina, Xiaoting Jia, John Ho, Daniel Nezich, Hyungbin Son, Vladimir Bulovic, Mildred S. Dresselhaus and Jing Kong, Nano Letters 9, 30-35 (2009) or L. G. De Arco, Yi Zhang, A. Kumar, and Chongwu Zhou, Nanotechnology, IEEE Transactions Vol. 8, 135-138 (2009) and PDMS: Keun Soo Kim, Yue Zhao, Houk Jang, Sang Yoon Lee, Jong Min Kim, Kwang S. Kim, Jong-Hyun Ahn, Philip Kim, Jae-Young Choi and Byung Hee Hong, Nature 457, 706-710 (2009).

These processes described may be decomposed into the following steps:

deposition of the polymer layer by molding or spin coating;
wet etching of the intermediate metal layer;
deposition of the polymer film+graphene on the receiving substrate.

In the case of PMMA, the polymer film is finally dissolved in a solvent. In the case of PDMS, either the polymer is the receiving substrate or it is used as a buffer (nano-imprint method).

It should be noted that the article by L. G. De Arco, Yi Zhang, A. Kumar and Chongwu Zhou, Nanotechnology, IEEE Transactions Vol. 8, 135-138 (2009) also describes simple wet etching of the substrate and deposition of the film on the growth substrate.

According to the present invention, the following transfer method illustrated by FIGS. 9a to 9e is proposed.

Figure 9A:
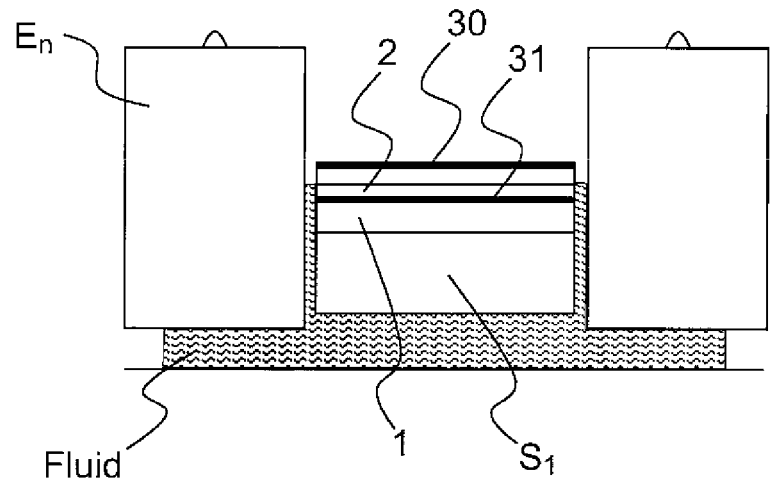

As illustrated in FIG. 9a, the 30/2/31 trilayer assembly on the surface of the substrate 1 is placed in an enclosure $E_n$ and positioned on a first support $S_1$ in the presence of a solution Fluid 1 for etching the metal layer 2, which typically may be an aqueous or alcoholic solution for specifically etching the metal employed (as an example, if the metal is nickel the solution Fluid 1 may be dilute hydrochloric acid).

When the metal layer has been removed, the substrate and the upper layer are separated by gently pressing on the growth substrate. Since the graphene layer is hydrophobic, it remains floating on the etching solution. The growth substrate runs.

Figure 9B:
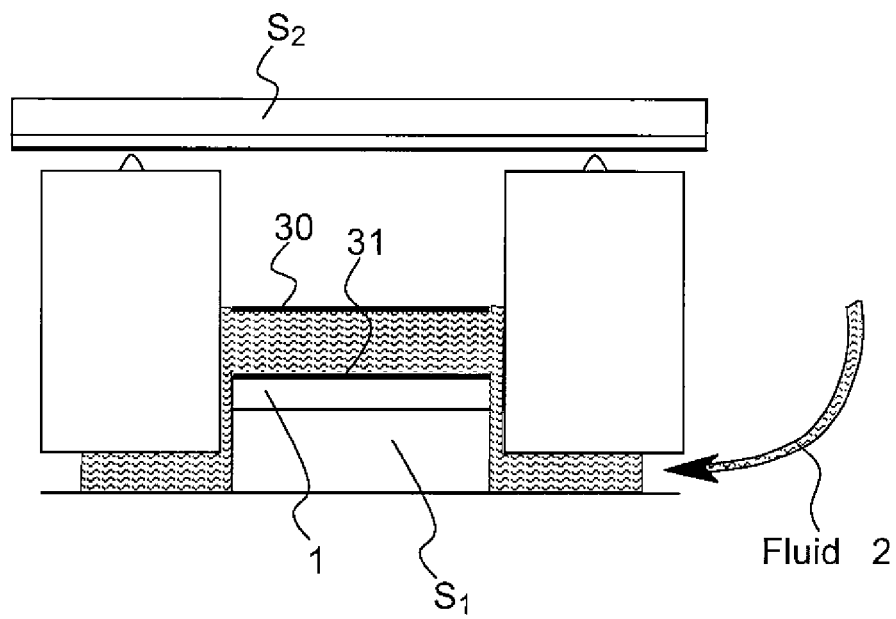

As illustrated in FIG. 9b, a second, receiving substrate $S_2$ is placed above the etching solution, the receiving face downward.

Liquid Fluid 2, for example water or ethanol, is added until the supernatant upper graphene layer 30 is brought into contact with the receiving substrate $S_2$ as illustrated in FIG. 9d.

The liquid Fluid 2 is then removed, leaving the upper graphene layer 30 on the surface of the receiving substrate $S_2$.

Advantageously, it is thus possible to recover, on the one hand, the graphene film 31 on the growth substrate and, on the other hand, the graphene film 30 on a nonrefractory substrate.

Fourth Example of a Process of the Invention:

To further improve the crystalline quality of the graphene, it may be advantageous in the process of the invention to use a laser for creating a particular temperature profile within the metal layer in which carbon atoms were implanted.

As illustrated in FIG. 10a, if the metal film formed by the metal layer was implanted with carbon in a zone Z, the metal is locally heated using a laser L that may be slowly moved over the substrate by a scanning movement as shown in FIG. 10b resulting, during cooling, in the formation of the upper graphene layer 30 and the lower graphene layer 31.

Under the action of the laser beam, the temperature increases sufficiently to completely dissolve the carbon in the metal. During cooling (the laser is scanned), the temperature decreases down to a threshold temperature Tc as illustrated in FIG. 3, below which the carbon starts to precipitate in the form of graphene. In this way, the graphene precipitates progressively as the laser advances, and its nucleation starts from the graphene that has already precipitated. The process is likened to lateral epitaxy and the crystalline quality of the graphine obtained is better than during direct precipitation. Under the laser beam, the temperature is high enough to completely dissolve the carbon in the metal. During cooling, the carbon precipitates, resulting in the formation of graphene layers on the surface and at the interface.

If the laser beam is in the form of a linear pencil beam as illustrated in FIG. 10c by using for example a cylindrical focusing lens, a graphene strip of width L (corresponding to the length of the pencil beam—see FIG. 10d that illustrates the typical form of the laser beam after being focused by a cylindrical lens) is thus generated on the surface of the metal and at the interface with the substrate.

Alternatively, the laser may just as well be focused onto a circular spot and very rapidly scanned in a direction y perpendicular to a direction x in the plane of the substrate and slowly in the direction x. Once the graphene has been obtained on the surface and at the interface, it is possible, as previously, to remove it by surface etching and by eliminating the metal in order to reveal the interface graphene.

The invention claimed is:

1. A controlled graphene film growth process comprising:
depositing a layer of metal on a surface of a substrate, wherein the metal of the metal layer is selected in response to the solubility of carbon in the metal;
exposing the layer of metal to a controlled flux of carbon atoms or carbon-containing radicals or carbon-containing ions at a first temperature disposed along a phase diagram of the metal in order to raise the concentration of carbon in the layer of metal to a molar concentration threshold ratio $C_M/C_M+C_C$, where $C_M$ is the molar metal concentration in a metal/carbon mixture and $C_C$ is a carbon solubility limit in said mixture at the first temperature, wherein the layer of metal forms a homogenous solid solution of carbon and metal;
increasing the carbon concentration in the metal/carbon layer by continuing to expose the metal/carbon layer to the controlled flux of carbon atoms or carbon-containing radicals or carbon-containing ions at the first temperature to modify the phase of the mixture into two phases, a metal phase and a graphite phase, wherein the carbon initially diffuses into the metal/carbon layer and then precipitates in response to the carbon concentration increasing above the molar concentration threshold ratio $C_M/C_M+C_C$ and the precipitating carbon forms at least a lower graphene film disposed between the metal/carbon layer and the surface and an upper graphene film at the surface of the metal/carbon layer;
eliminating the upper graphene film; and
eliminating the layer of metal.

2. The process as claimed in claim 1, further comprising an operation of chemically etching the metal layer.

3. The process as claimed in claim 1, further comprising:
an operation of chemically attacking the metal layer to detach the upper graphene film and to expose the lower graphene film; and a step of transferring the upper graphene film to a second substrate.

4. The process as claimed in claim 3, further comprising:
placing the substrate comprising the lower graphene film, the metal layer and the upper graphene film in an enclosure in the presence of a first solution for chemically etching the metal layer;
positioning the second substrate facing the assembly formed by the two graphene films and the metal layer; and
flowing a stream of a second solution to bring the upper graphene film into contact with the second substrate after the metal layer has been chemically attacked.

5. The process as claimed in claim 4, wherein the second substrate is made of a nonrefractory glass or polymer material.

6. The process as claimed in claim 3, wherein the second substrate is made of a nonrefractory glass or polymer material.

7. The process as claimed in claim 1, wherein the operation for modifying the phase of the mixture into two phases, a metal phase and a graphite phase respectively, includes increasing the carbon concentration in the carbon solid solution in the metal.

8. The process as claimed in claim 1, further comprising a step of exposure to an oxidizing plasma to eliminate the upper graphene film.

9. The process as claimed in claim 1, wherein the exposure to a controlled flux of carbon atoms or carbon-containing radicals or carbon-containing ions is carried out in a reactor using a gaseous precursor of the $CH_4$, $C_2H_2$ or $C_6H_6$ at a temperature of between about 450° C. and about 900° C.

10. The process as claimed in claim 9, wherein a subsequent annealing step is carried out by means of a laser.

11. The process as claimed in claim 10, wherein the laser is scanned in a plane parallel to the plane of the substrate so as to precipitate the graphene and promote the nucleation of graphene atoms after passage of said laser.

12. The process as claimed in claim 1, wherein the exposure to a controlled flux of carbon atoms or carbon-containing radicals or carbon-containing ions is carried out by ion implantation.

13. The process as claimed in claim 12, further comprising, after the ion implantation operation, an annealing step enabling the carbon atoms within the metal layer to be homogenized, followed by a controlled cooling step, to precipitate the carbon.

14. The process as claimed in claim 12, wherein a subsequent annealing step is carried out by means of a laser.

15. The process as claimed in claim 1, wherein the metal layer is produced by epitaxy, the substrate being an inert single-crystal substrate selected from one of sapphire, quartz, magnesium oxide and a spinel.

16. The process as claimed in claim 1, wherein the metal is selected from a group consisting of cobalt, nickel, gold, copper, transition metals, and noble metals.

17. The process as claimed in claim 4, wherein the exposure to a controlled flux of carbon atoms or carbon-containing radicals or carbon-containing ions is carried out in a reactor using a gaseous precursor of the $CH_4$, $C_2H_2$ or $C_6H_6$ at a temperature of between about 450° C. and about 900° C.

18. The process as claimed in claim 4, wherein the exposure to a controlled flux of carbon atoms or carbon-containing radicals or carbon-containing ions is carried out by ion implantation.

19. The process as claimed in claim 4, wherein the metal layer is produced by epitaxy, the substrate being an inert single-crystal substrate selected from one of sapphire, quartz, magnesium oxide and a spinel.

20. The process as claimed in claim 4, wherein the metal is selected from a group consisting of cobalt, nickel, gold, copper, transition metals, and noble metals.

* * * * *